(12) United States Patent
Xie et al.

(10) Patent No.:    US 12,588,280 B2
(45) Date of Patent:       Mar. 24, 2026

(54) BACKSIDES SUBTRACTIVE M1 PATTERNING WITH BACKSIDE CONTACT REPAIR FOR TIGHT N2P SPACE

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Nicholas Anthony Lanzillo, Wynantskill, NY (US); Daniel Charles Edelstein, White Plains, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 18/322,620

(22) Filed: May 24, 2023

(65)            Prior Publication Data
US 2024/0395822 A1      Nov. 28, 2024

(51) Int. Cl.
| | |
|---|---|
| H10D 86/00 | (2025.01) |
| H10D 84/03 | (2025.01) |
| H10D 86/01 | (2025.01) |
| H10D 84/01 | (2025.01) |

(52) U.S. Cl.
CPC ............. H10D 86/00 (2025.01); H10D 86/01 (2025.01); *H10D 84/0149* (2025.01); *H10D 84/038* (2025.01)

(58) Field of Classification Search
CPC ........... H10D 30/6735; H10D 84/0149; H10D 86/00; H01L 23/5286
See application file for complete search history.

(56)          References Cited

U.S. PATENT DOCUMENTS

| | | |
|---|---|---|
| 11,101,217 B2 | 8/2021 | Xie |
| 11,521,927 B2 | 12/2022 | Xie |
| 2020/0294998 A1 | 9/2020 | Lilak |
| 2021/0111115 A1 | 4/2021 | Patrick |
| 2021/0134721 A1 | 5/2021 | Chiang |
| 2021/0202385 A1 | 7/2021 | Huang |
| 2021/0305252 A1 | 9/2021 | Chiang |

(Continued)

OTHER PUBLICATIONS

Ryckaert et al., "Extending the roadmap beyond 3nm through system scaling boosters: A case study on Buried Power Rail and Backside Power Delivery", Electron Devices Technology and Manufacturing Conference (EDTM), © 2019 IEEE, pp. 50-52.

*Primary Examiner* — Nelson Garces

(74) *Attorney, Agent, or Firm* — Samuel A. Waldbaum

(57)          ABSTRACT

A microelectronic structure including a first nanosheet transistor including a first backside metal line that has a first width as measure along a bottom surface of the first backside metal line and the first backside metal line has a second width as measure along a top surface of the first backside metal line. A second backside metal line that includes a second backside contact that is connected to the second source drain and the second backside metal line has a third width as measure along a bottom surface of the second backside metal line. The second backside metal line has a fourth width as measure along a top surface of the second backside metal line. The first width is larger than the second width and the third width is larger than the fourth width.

16 Claims, 17 Drawing Sheets

(56) References Cited

U.S. PATENT DOCUMENTS

| 2021/0305381 | A1  |  9/2021 | Chiang |            |
|--------------|-----|---------|--------|------------|
| 2021/0351303 | A1  | 11/2021 | Ju     |            |
| 2021/0376071 | A1  | 12/2021 | Liu    |            |
| 2021/0376093 | A1  | 12/2021 | Chu    |            |
| 2022/0223698 | A1  |  7/2022 | Xie    |            |
| 2022/0352032 | A1  | 11/2022 | Lilak  |            |
| 2022/0367269 | A1  | 11/2022 | Lin    |            |
| 2022/0367705 | A1  | 11/2022 | Yu     |            |
| 2023/0069119 | A1* |  3/2023 | Peng   | H10D 62/122 |
| 2023/0369222 | A1* | 11/2023 | Engel  | H10D 30/014 |

* cited by examiner

TOP DOWN VIEW

CROSS- SECTION X

CROSS- SECTION Y

FIG. 4

CROSS- SECTION X

FIG. 5
CROSS- SECTION Y

CROSS- SECTION X

CROSS- SECTION Y

CROSS- SECTION X

CROSS- SECTION Y

CROSS- SECTION X

CROSS-SECTION Y

FIG. 12
CROSS- SECTION X

CROSS-SECTION Y

CROSS- SECTION X

CROSS-SECTION Y

CROSS- SECTION X

CROSS-SECTION Y

BACKSIDES SUBTRACTIVE M1 PATTERNING WITH BACKSIDE CONTACT REPAIR FOR TIGHT N2P SPACE

BACKGROUND

The present invention generally relates to the field of microelectronics, and more particularly to formation of backside contacts by utilizing a subtractive etch process and repairing miss-alignment errors.

Nanosheet is the lead device architecture in continuing CMOS scaling. However, nanosheet technology has shown issues when scaling down such that as the devices become smaller and closer together, they are interfering with each other. With the number of devices being fitted in a smaller area it is becoming harder to form to separate backside contacts with the necessary spacing limited by lithographic printing.

BRIEF SUMMARY

Additional aspects and/or advantages will be set forth in part in the description which follows and, in part, will be apparent from the description, or may be learned by practice of the invention.

A microelectronic structure including a first nanosheet transistor including a first source/drain and a second nanosheet transistor including a second source drain. A first backside metal line that includes a first backside contact that is connected to the first source drain. The first backside metal line has a first width as measure along a bottom surface of the first backside metal line and the first backside metal line has a second width as measure along a top surface of the first backside metal line. The first width and the second width are measured through a source/drain region in parallel to a gate direction. A second backside metal line that includes a second backside contact that is connected to the second source drain and the second backside metal line has a third width as measure along a bottom surface of the second backside metal line. The second backside metal line has a fourth width as measure along a top surface of the second backside metal line. The third width and the fourth width are measured through the source/drain region in parallel to the gate direction and the first width is larger than the second width and the third width is larger than the fourth width. A backside metal line cut located between the first backside metal line and the second backside metal line.

A microelectronic structure including a first nanosheet transistor including a first source/drain and a second nanosheet transistor including a second source drain. A first backside metal line that includes a first backside contact that is connected to the first source drain and the first backside metal line has a first width as measure along a bottom surface of the first backside metal line. The first backside metal line has a second width as measure along a top surface of the first metal line contact and the first width and the second width are measured through a source/drain region in parallel to a gate direction. A second backside metal line that includes a second backside contact that is connected to the second source drain and the second backside metal line has a third width as measure along a bottom surface of the second backside metal line. The second backside metal line has a fourth width as measure along a top surface of the second backside metal line and the third width and the fourth width are measured through the source/drain region in parallel to the gate direction. The first width is larger than the second width and the third width is larger than the fourth width. A shallow trench isolation layer located around the first backside contact. A backside metal line cut located between the first backside metal line and the second backside metal line and the backside metal line cut extends into the first backside contact.

A method including the steps of forming a first nanosheet transistor including a first source/drain and a second nanosheet transistor including a second source drain. Forming a single metal layer on the backside of the first nanosheet transistor and the second nanosheet transistor. The single metal layer includes a first backside contact that is in contact with a backside surface of the first source/drain and the single metal layer includes a second backside contact that is in contact with a backside surface of the second source/drain. Utilizing a subtractive etch process to forming a plurality of trenches that separate the single metal layer into a plurality of backside metal lines. Forming a backside metal line cut by lining the plurality of trenches with a repair liner and filling the trenches with a dielectric fill layer.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 4 illustrates a cross section X of the nano stack after formation of frontside contacts, a back-end-of-the-line (BEOL) layer, and a carrier wafer, in accordance with the embodiment of the present invention.

FIG. 5 illustrates a cross section Y of the source/drain region after formation of frontside contacts, a back-end-of-the-line (BEOL) layer, and a carrier wafer, in accordance with the embodiment of the present invention.

FIG. 12 illustrates a cross section X of the nano stack after formation of a repair liner, in accordance with the embodiment of the present invention.

DETAILED DESCRIPTION

Figure 1:
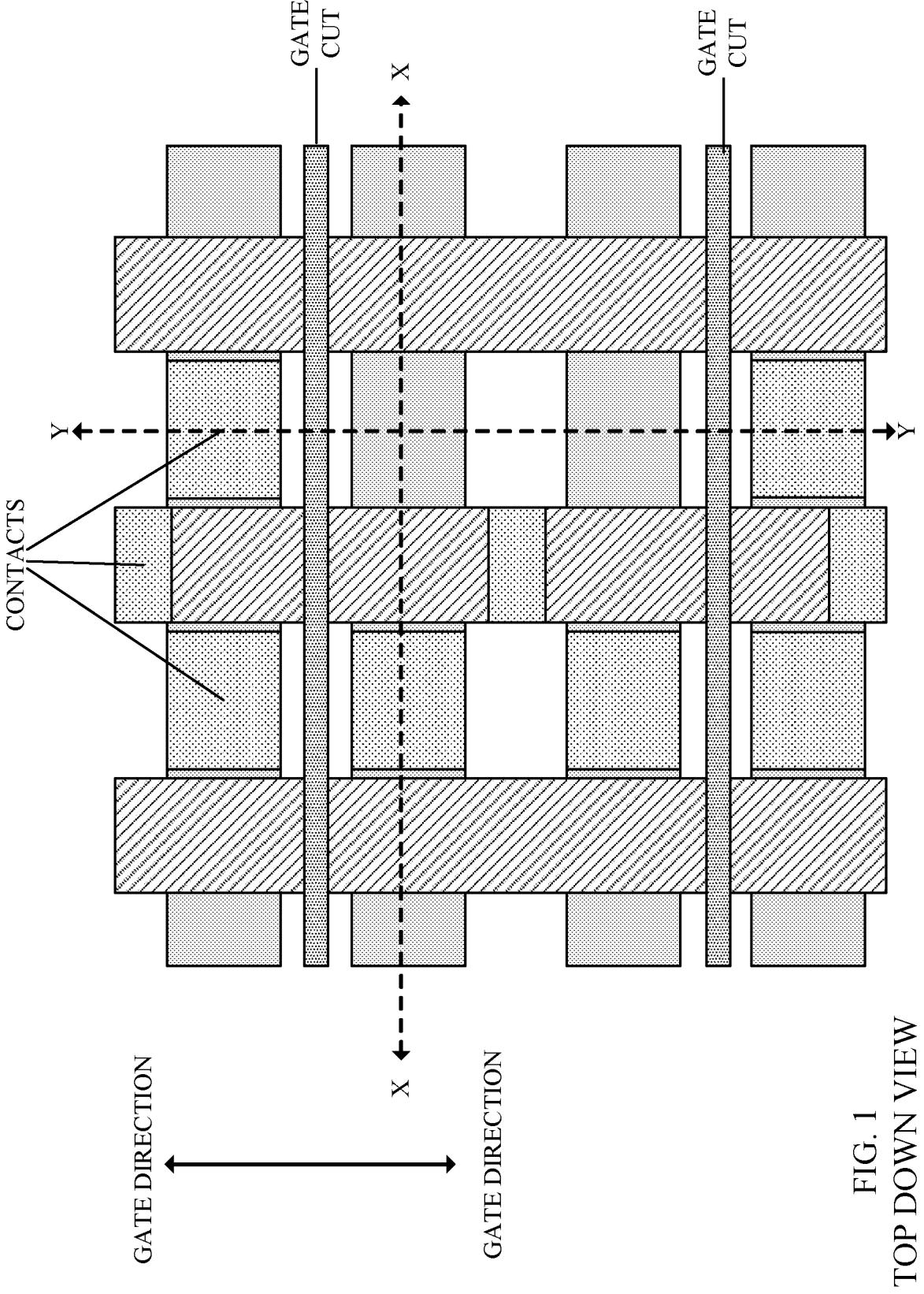
FIG. 1 illustrates a top-down view of multiple nano devices/nanosheet transistors, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

Typically, a backside metal line trench is formed by creating a trench in a backside interlayer dielectric layer, such that the widest part of the trench is the top surface of the backside metal line. This means that the corner of the top surface of the backside metal line is the point that is located closest to any adjacent backside metal line. The distance between corners, or the tip to tip spacing, is the smallest at this location, which can lead to shorts between adjacent backside metal lines because of the small tip to tip spacing. Furthermore, the spacing/pitch of the typical backside metal lines is limited by the lithographic printing process. If a sub lithographic process is used, then the tip to tip spacing is increased but also leads to a reduction in the overlapping area between the backside metal line and backside contacts. The reduction of the overlapping area between backside metal line and backside contact lead to an increase in the resistance of the backside interconnect.

In contrast the present invention is directed to forming the first backside metal line level through a subtractive etch process. A uniform/single metal layer is formed on the backside surface of the nanosheet device, and the single metal layer is separated into a plurality of metal lines through a subtractive etching process. The subtractive etching process leads to the backside metal lines having its widest part being its bottom surface (e.g., the surface that defines the overlapping area between backside contacts and backside metal line), while the top surface of the backside metal line is the narrowest surface. Furthermore, since a subtractive etching process is used, then a sub-lithographic process can be utilized to shrink the size of the separating cuts.

Miss-alignment of the subtractive etch can occur, meaning that some portions of the metal in backside contact are mistakenly removed. The subtractive etch process allows for repairing any damage caused by miss-alignment. An atomic layer deposition process or selective metal growth process lines the trenches with a conductive metal, for example, Ru or W. The conductive metal liner fills in any miss-alignment errors and allows for the formation of a dielectric fill layer to separate the metal lines.

FIG. 1 illustrates a top-down view of multiple devices, in accordance with the embodiment of the present invention. The cross-section X extends horizontally through the nano stacks of one of the devices. Cross section Y is perpendicular to cross section X, where cross section Y is through a source/drain region that spans across multiple nano stacks.

Figure 2:
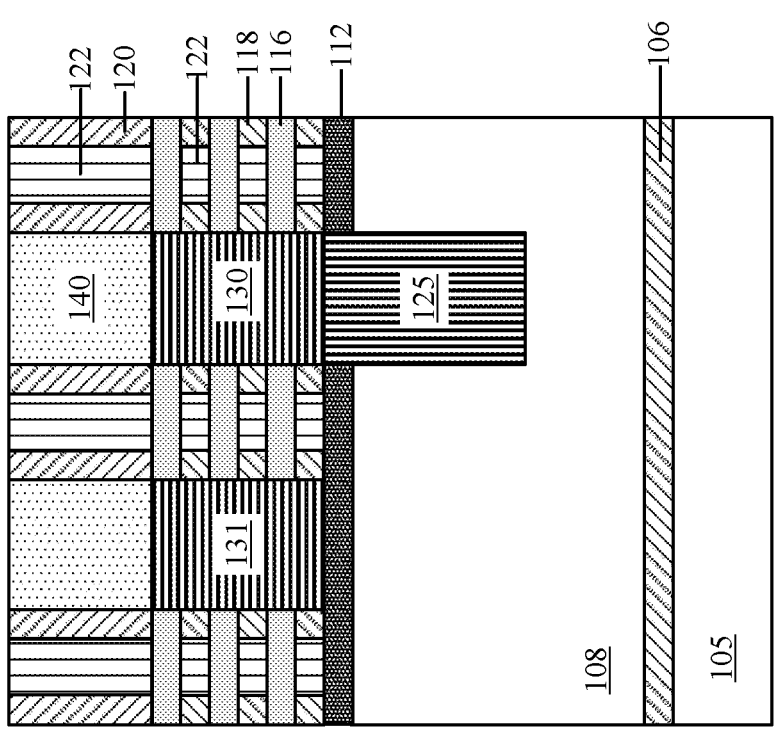
FIG. 2 illustrates a cross section X of the nano stack after formation of the gate, placeholders, the source/drains, and the frontside interlayer dielectric layer, in accordance with the embodiment of the present invention.
Figure 3:
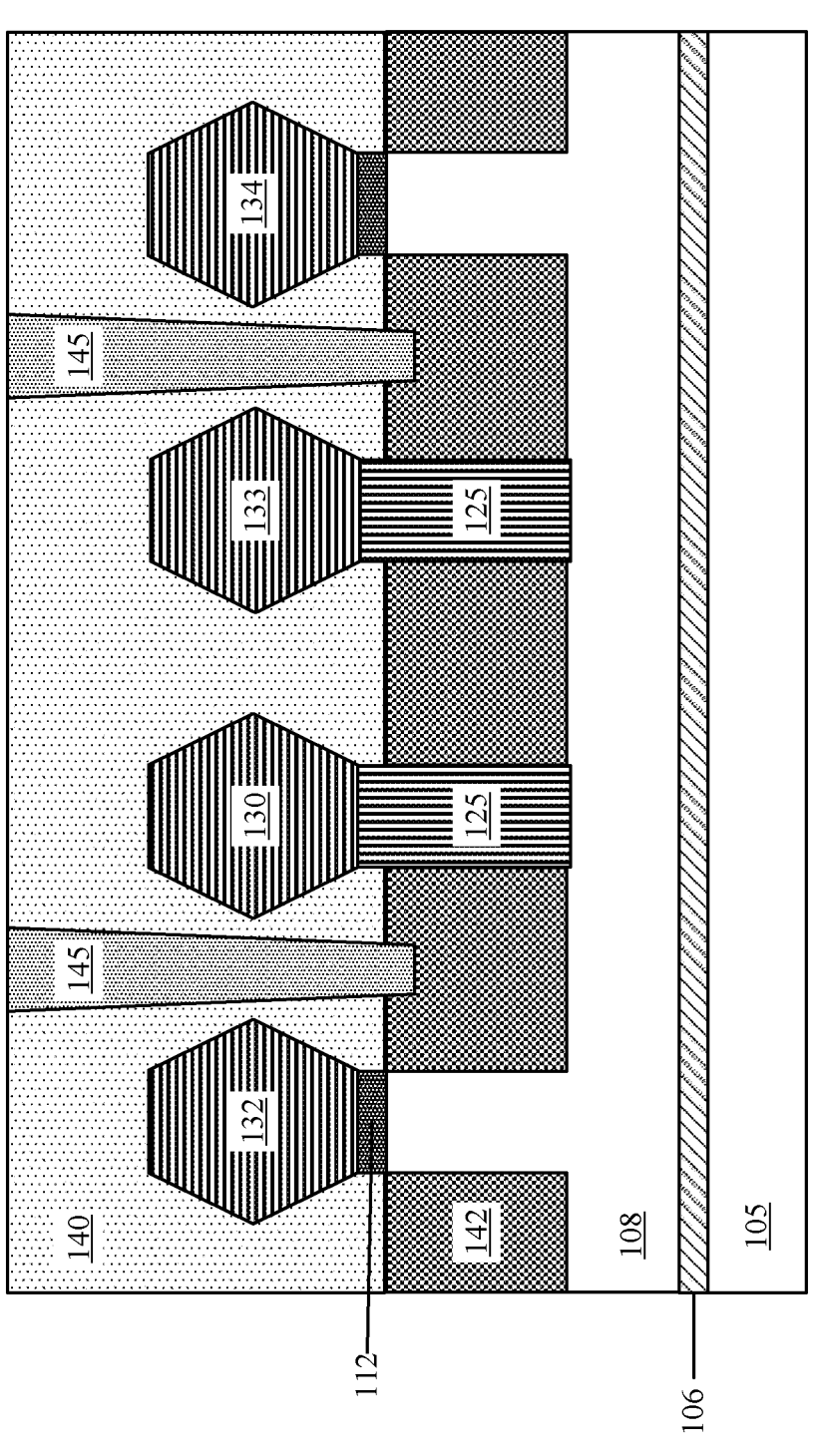
FIG. 3 illustrates a cross section Y of the source/drain region after formation of the gate, the placeholders, the source/drains, the frontside interlayer dielectric layer, and dielectric gate cuts, in accordance with the embodiment of the present invention.

FIGS. 2, and 3 illustrate the processing stage after formation of the gate, placeholders, the source/drains, and the frontside interlayer dielectric layer.

FIG. 2 illustrates the nanosheet transistors that includes a first substrate 105, an etch stop 106, a second substrate 108, a bottom dielectric layer 112, a plurality of nanosheet columns. The nanosheet columns are comprised of a plurality of channel layers 116, an inner spacer 118, an upper spacer 120, and a gate 122. The plurality of channel layers 116 can be comprised of, for example, Si. The source/drains 130, 131 are located between nanosheet columns. A placeholder 125 can be located beneath a source/drain 130 and a frontside interlayer dielectric layer 140 can be located on top of the source/drains 130, 131.

The first substrate 105 and the second substrate 108 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the first substrate 105 and the second substrate 108. In some embodiments, first substrate 105 and the second substrate 108 includes both semiconductor materials and dielectric materials. The semiconductor first substrate 105 and the second substrate 108 may also comprise an organic semiconductor or a layered semiconductor such as, for example, Si/SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein. Gate 122 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W.

FIG. 3 illustrates a cross section across the source/drain region. A shallow trench isolation layer 142 is located in trenches (not shown) that were formed in the second substrate 108. The source/drain region includes the first source/drain 130, a third source/drain 132, a fourth source/drain 133, and a fifth source/drain 134. The bottom dielectric layer 112 is located beneath the third source/drain 132 and the fifth source/drain 134. Placeholder 125 is located beneath the first source/drain 130 and the fourth source/drain 133. Gate cut 145 is formed in the frontside interlayer dielectric layer 140, where the gate cut 145 is located between the first source/drain 130 and the third source/drain 132, and another gate cut 145 is located between the fourth source/drain 133 and the fifth source/drain 134.

The first source/drain 130, the second source/drain 131, the third source/drain 132, the fourth source/drain 133, and the fifth source/drain 134 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 4:
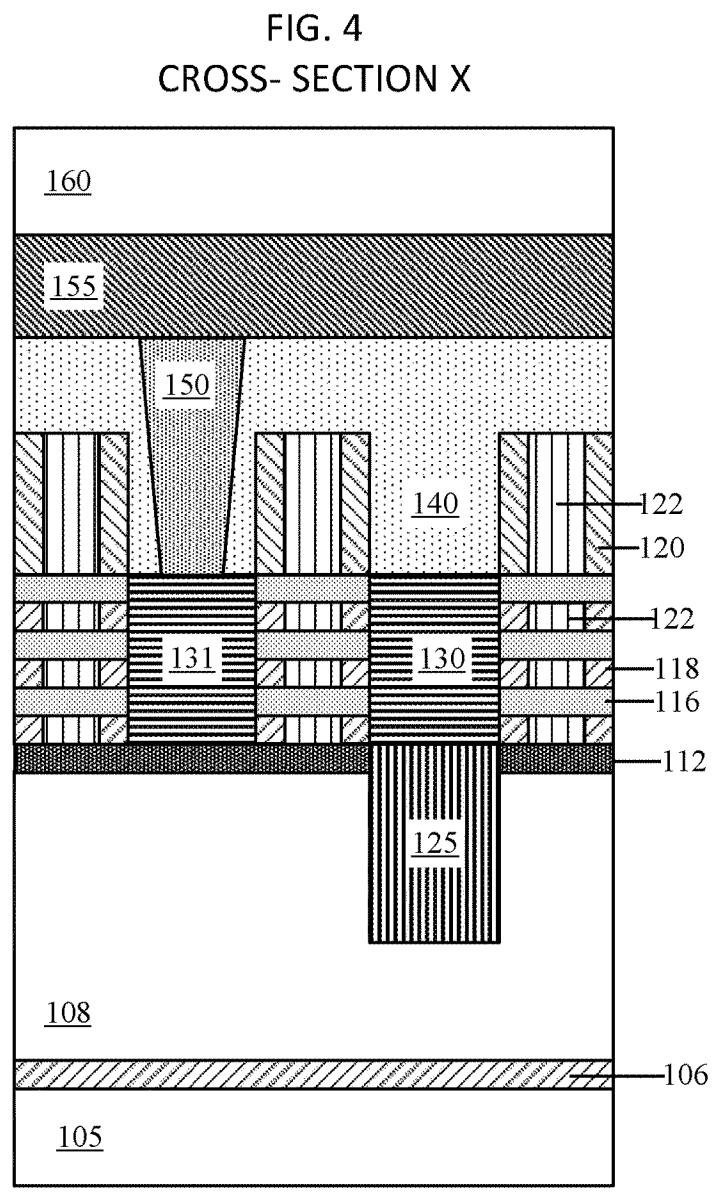
Figure 5:
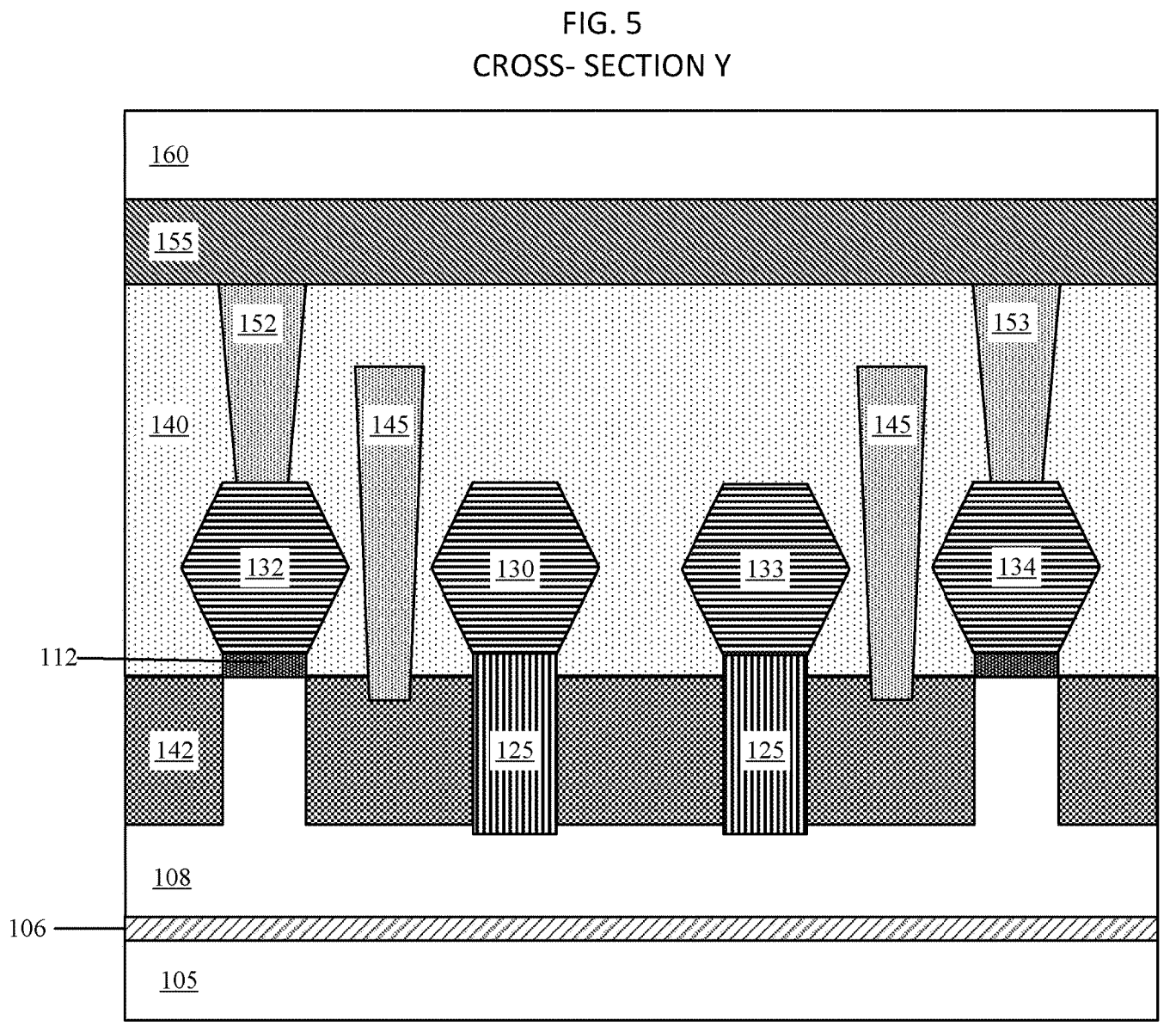

FIGS. 4 and 5 illustrate the processing stage after formation of frontside contacts 150, 152, 153, a back-end-of-the-line (BEOL) layer 155, and a carrier wafer 160. Additional frontside interlayer dielectric layer 140 is added to increase the height of the layer and to cover the frontside surfaces of the gate 122 and the upper spacer 120. A plurality of trenches (not shown) is formed in the frontside interlayer dielectric layer 140. Each of the plurality of trenches expose a top surface of one of the source/drains, for example, the top surface of the second source/drain 131, the third source/drain 132, and the fifth source/drain 134 is exposed. The plurality of trenches is filled with a conductive metal to form a plurality of frontside contacts 150, 152, and 153. Frontside contact 150 is located above the second source/drain 131, frontside contact 152 is located above the third source/drain 132, and frontside contact 153 is located above the fifth source/drain 134. The BEOL layer 155 is located on top of the frontside interlayer dielectric layer 140 and on top of the frontside contact 150, 152, 153. A carrier wafer 160 is located on top of the BEOL layer 155, where the carrier wafer 160 allows for the device to be flipped over for backside processing.

Figure 6:
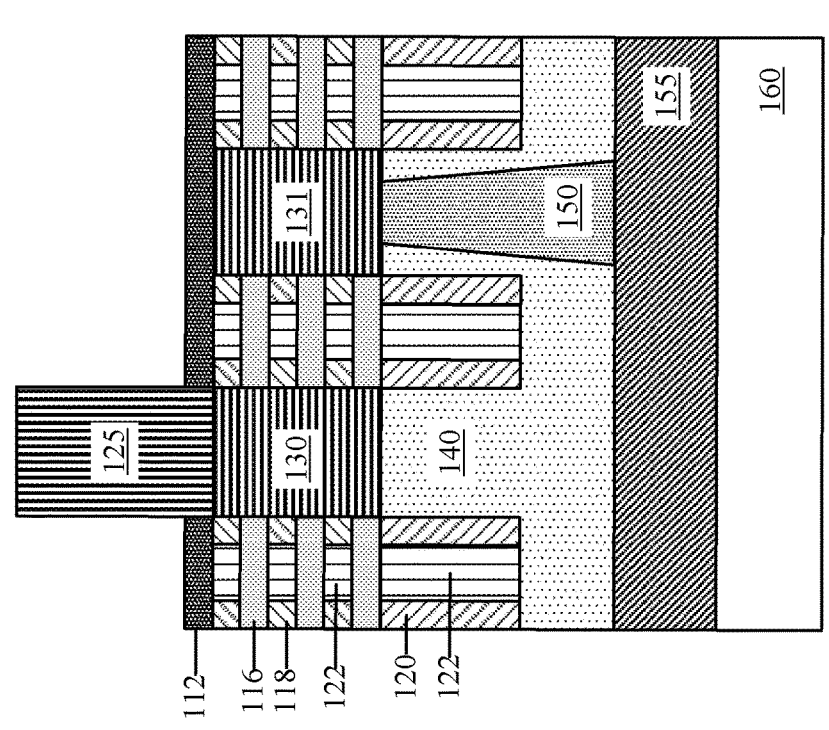
FIG. 6 illustrates a cross section X of the nano stack after flipping the devices over for backside processing and after the removal of the first substrate, the etch stop and the second substrate, in accordance with the embodiment of the present invention.
Figure 7:
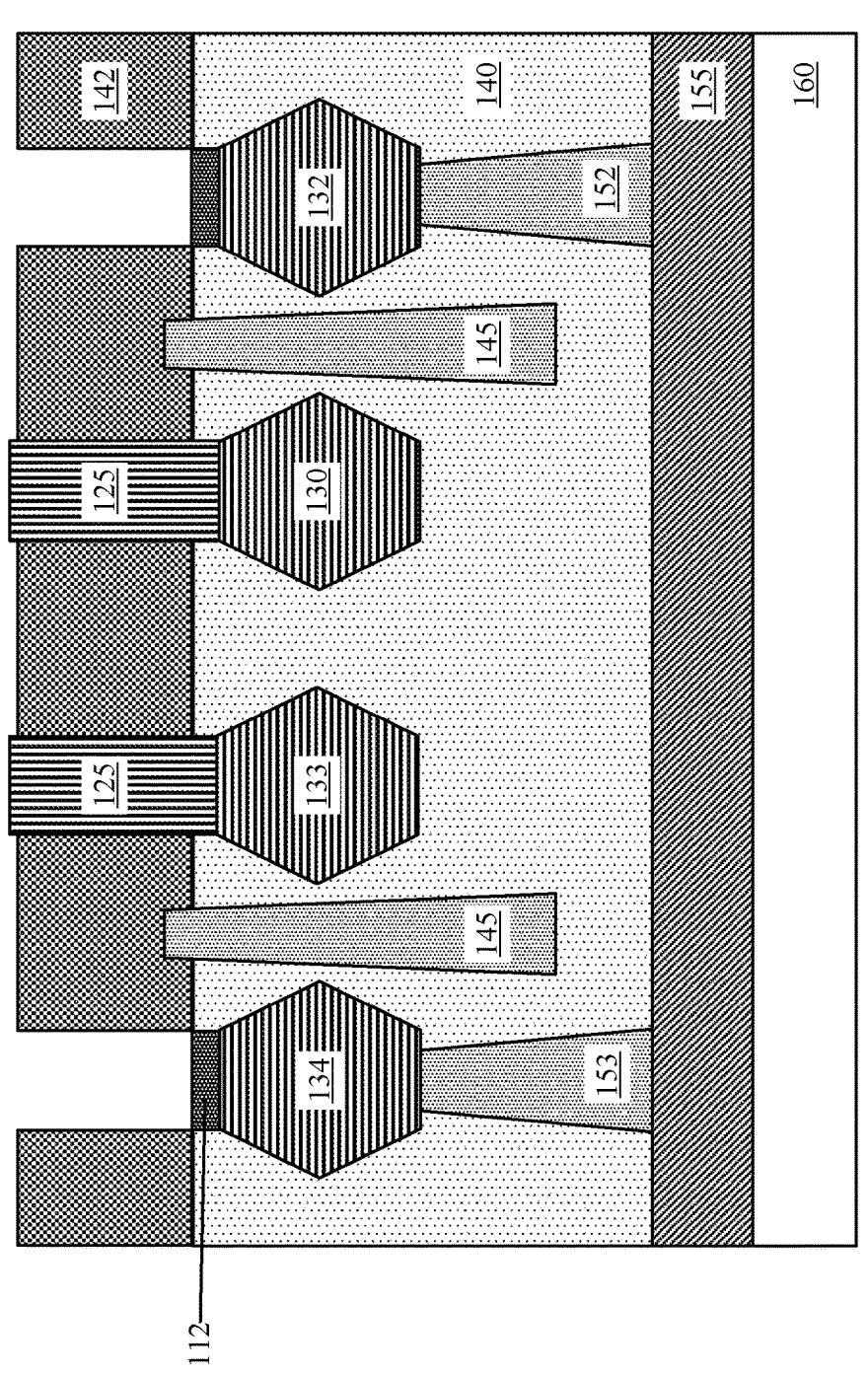
FIG. 7 illustrates a cross section Y of the source/drain region after flipping the devices over for backside processing and after the removal of the first substrate, the etch stop and the second substrate, in accordance with the embodiment of the present invention.

FIGS. 6 and 7 illustrate the processing stage after flipping the devices over for backside processing and after the removal of the first substrate 105, the etch stop 106 and the second substrate 108. The nanosheet device/nanosheet transistors are flipped over to allow for the backside processing of the device. The first substrate 105 is removed by, for example, a combination of wafer grinding, chemical mechanical processing (CMP), dry Si etch, and wet Si etch processes to the etch stop 106. The etch stop 106 and the second substrate 108 are removed to expose the backside surfaces of the components of the device.

Figure 8:
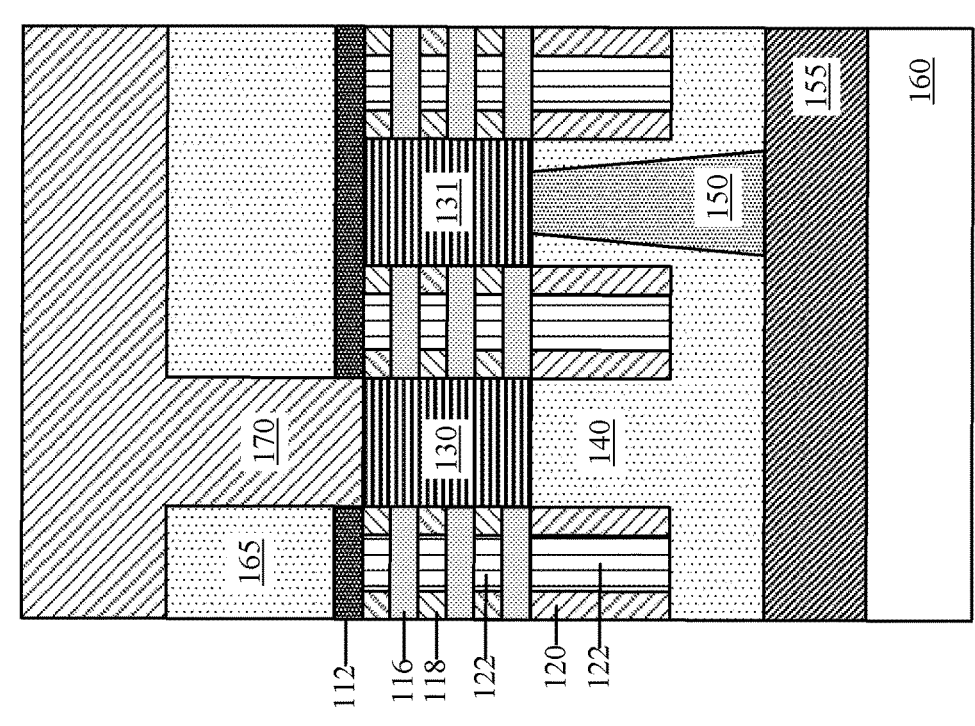
FIG. 8 illustrates a cross section X of the nano stack after formation of a backside interlayer dielectric layer, removal of the placeholders and formation of a metal layer, in accordance with the embodiment of the present invention.
Figure 9:
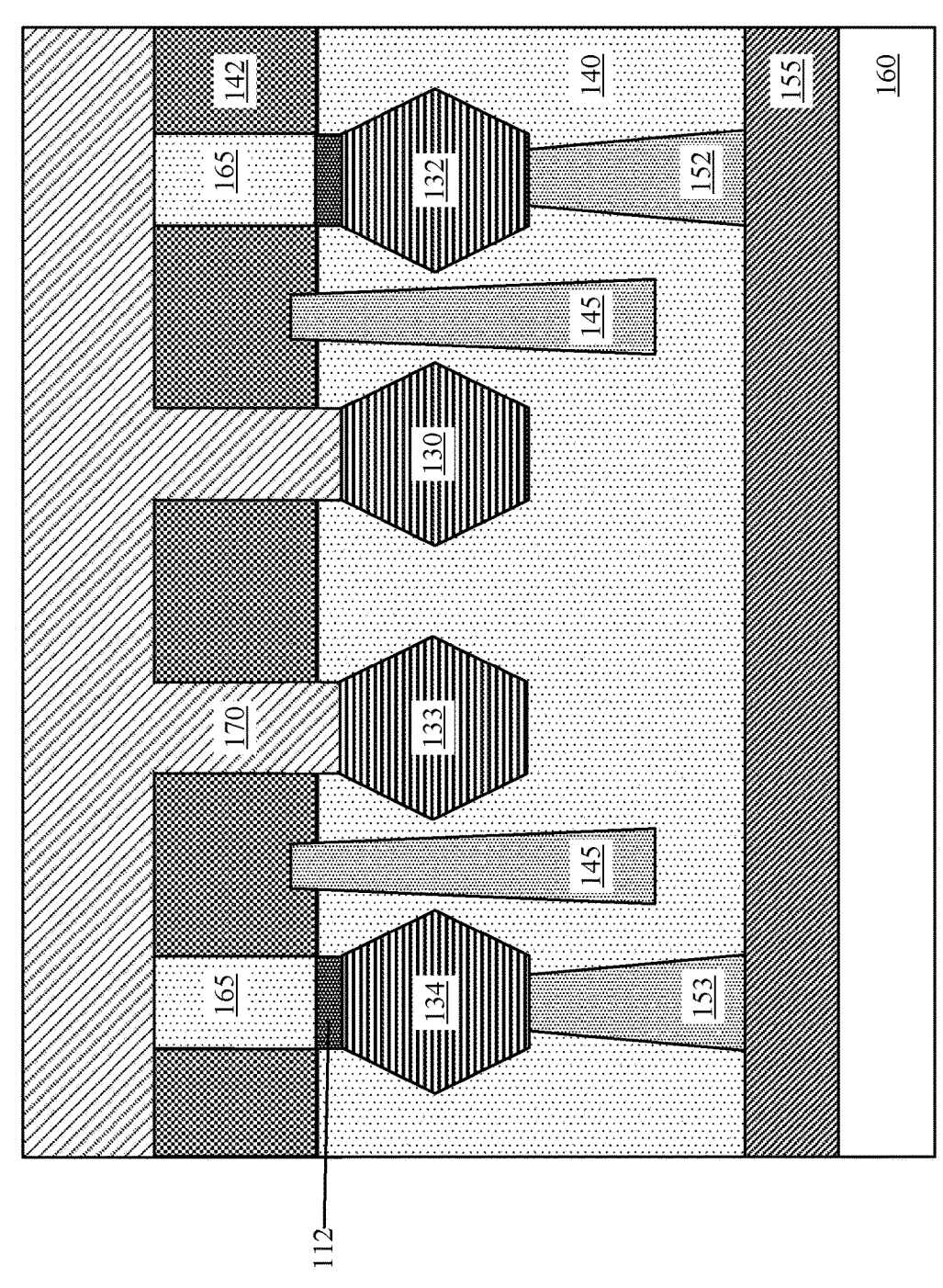
FIG. 9 illustrates a cross section Y of the source/drain region after formation of a backside interlayer dielectric layer, removal of the placeholders and formation of a metal layer, in accordance with the embodiment of the present invention.

FIGS. 8 and 9 illustrate the processing stage after formation of a backside interlayer dielectric layer 165 followed by CMP, the removal of the placeholders 125, and formation of a metal layer 170. A backside interlayer dielectric layer 165 is formed on the exposed surface around the shallow trench isolation layer 142. The backside interlayer dielectric layer 165 forms on the backside of the bottom dielectric layer 112 located on the second source/drain 131, the third source/drain 132, and the fifth source/drain 134. The placeholders 125 are removed to expose a backside surface of the first source/drain 130 and a backside surface of the fourth source/drain 133. A continuous/single metal layer 170 is formed on top of the backside interlayer dielectric layer 165, the shallow trench isolation layer 142, and in the locations where the placeholder 125 was removed. Therefore, the metal layer 170 includes protrusion that extends towards the backside surface of the first source/drain 130 and the fourth source/drain 133. Therefore, the metal layer 170 is located on the backside of the first source/drain 130 and on the backside of the fourth source/drain 133. The composition of the metal layer 170 comprises a silicide liner, such as Ti, Ni, NiPt, a metal adhesion layer, such as TiN, and low resistance metal fill layer, such as W, Ru, Co. The lower portions of the metal layer 170 which fills into the space previously occupied by placeholder 125 defines the location of backside contacts (BSCA), and first backside metal line (backside M1 or power rail) will be formed in subsequent process flow described below using metal layer 170 above BSCA.

Figure 10:
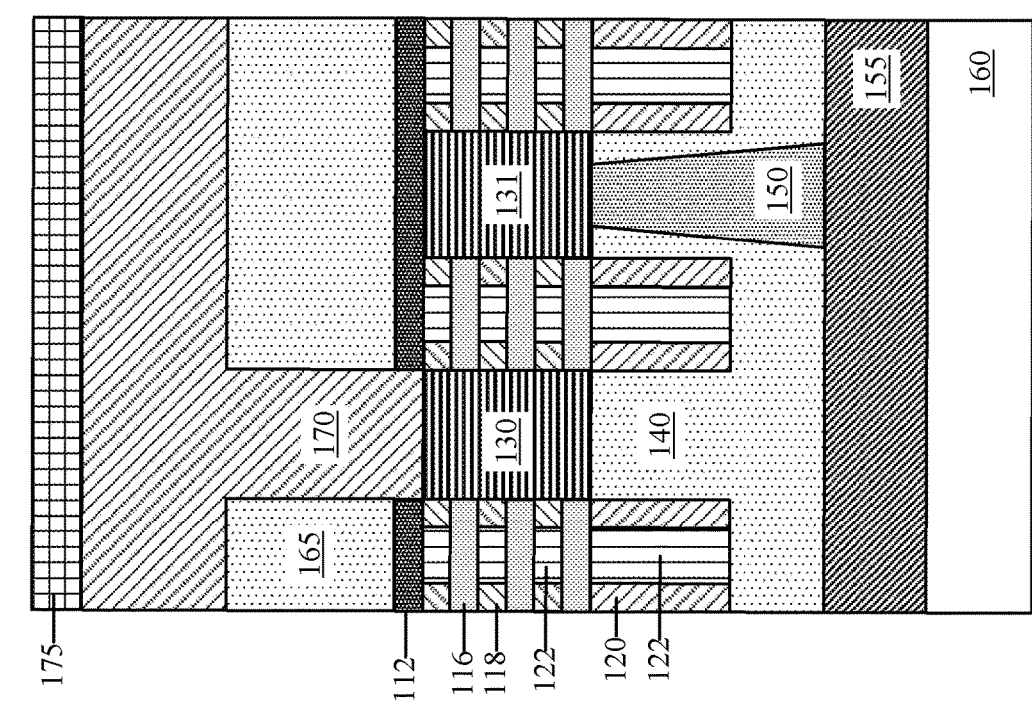
FIG. 10 illustrates a cross section X of the nano stack after formation of a lithography layer and patterning of the metal layer to form multiple contacts, in accordance with the embodiment of the present invention.
Figure 11:
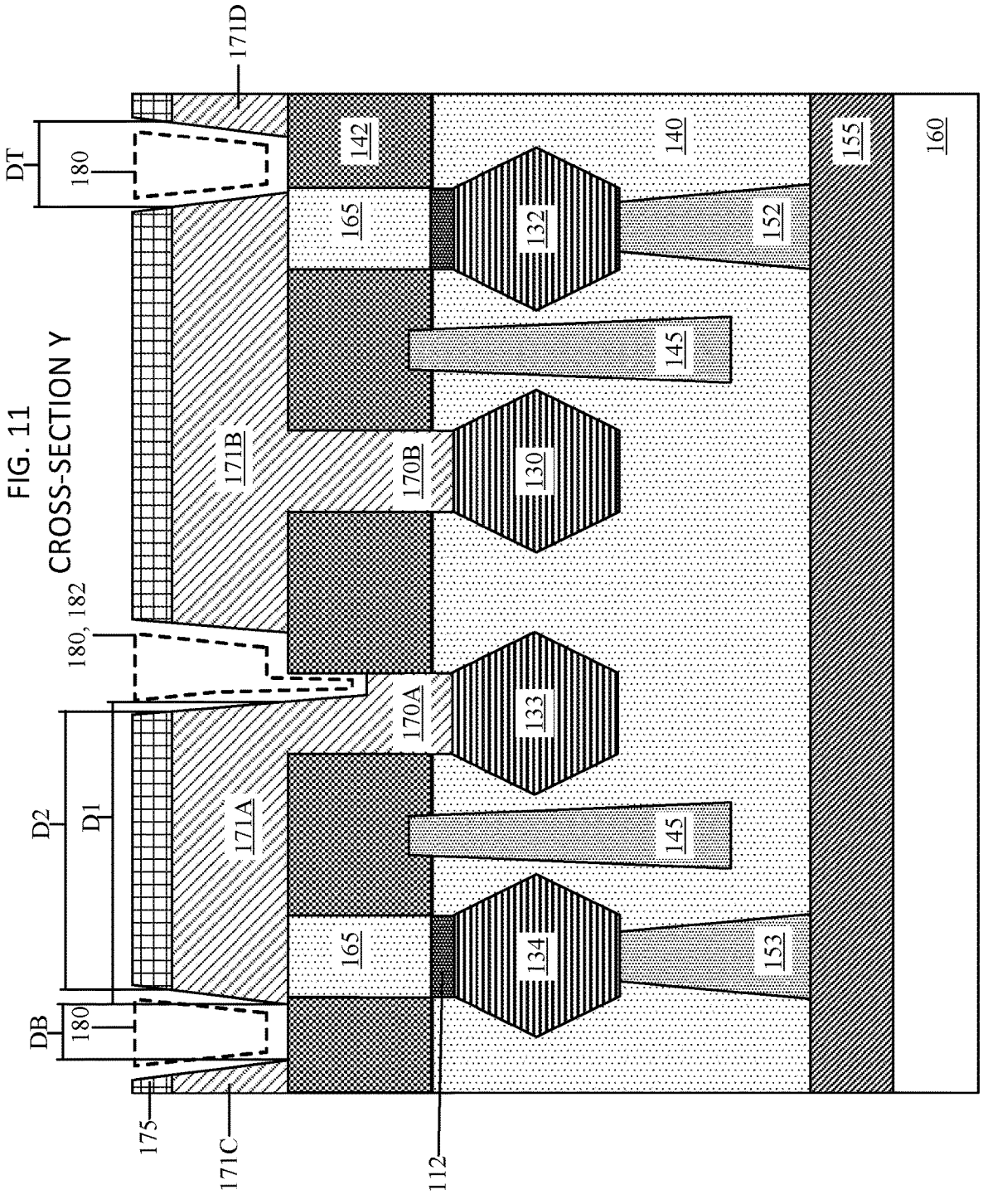
FIG. 11 illustrates a cross section Y of the source/drain region after formation of a lithography layer and patterning of the metal layer to form multiple contacts, in accordance with the embodiment of the present invention.

FIGS. 10 and 11 illustrate the processing stage after formation of a lithography layer 175 and patterning of the metal layer 170 to form multiple backside contacts 170A, 170B and a plurality of metal lines 171A, 171B, 171C, 171D. A lithography layer 175 is formed on top of the metal layer 170. The metal layer 170 is patterned through a conventional lithography process followed by subtractive metal etching process to form a plurality of trenches 180. Since a subtractive etching process is utilized, then the size of the trenches 180 is not limited to the lithography layer 175 printing process. A sub-lithographic patterning process can be utilized to form trenches 180 that are smaller than trenches formed under the non-sub-lithographic patterning process. Trenches 180 have a top width DT and a bottom width DB, where DT is larger than DB. The top width DT and the bottom width DB can be shortened by using a sub-lithographic patterning process. The widths DT and DB are measured through the source/drain region in parallel to the gate direction. The patterning process separates the single metal layer 170 into multiple backside contacts 170A, 170B and a plurality of metal lines 171A, 171B, 171C, 171D. For example, metal line 171A includes the protrusion or backside metal contact 170A that is in contact with the backside surface of the fourth source/drain 133, and metal line 171B includes the protrusion or a backside metal contact 170B that is contact with the backside surface of the first source/drain 130. By shrinking the value/size of width DB and width DT causes the size of the metal lines 171A, 171B, 171C, 171D, and reduces the distance between adjacent metal lines. For example, metal line 171A top surfaces has a width D2 and a bottom surface width D1, where the width D2 is larger than the width D1. The widths D1 and D2 are measured through the source/drain region in parallel to the gate direction. Shrinking value/size of width DB and width DT causes the value/size of width D1 and D2 to increase. FIG. 11 illustrates the formation of two backside contacts 170A and 170B, but this is for example purposes only. Multiple source/drains 130, 132, 133, and 134 can be connected to separated metal lines (e.g., metal lines 171A, 171B, 171C, 171D), or the source/drains 130, 132, 133, and 134 can be connected to a shared metal line (e.g., the fifth source/drain 134 and fourth source/drain 133 can be connected to a shared metal line 171A).

The lithographic patterning process is not perfect, and a miss-alignment can occur. FIG. 11 illustrates a miss-aligned trench 182, where the miss-alignment causes damage to the contacts. The miss-aligned trench 182 can remove a portion of backside contact 170A that should not have been removed, for example, the miss-aligned trench 182 can remove a portion of the protrusion of backside contact 170A that extends down towards the backside surface of the fourth source/drain 133. The miss-aligned trench 182 damages the backside contact 170A thus changing the dimensions of the overlapping area between backside metal line 171A and backside contact 170A. The miss-alignment can cause an increase of the resistance between the connection of backside metal line 171A to backside contact 170A. The patterning process can form one or more miss-aligned trenches 182 and miss-aligned trenches 182 can be located at different areas than depicted by the Figures. The Figures illustrate one of type damage caused by a miss-aligned trench 182, but other types of damage caused by miss-alignment can occur. The type of miss-alignment damage that is illustrated by this disclosure is not meant to be seen as limiting. The repairing of the miss-alignment, which will be described in further detail below, can be applied to repair other types of damage then what is shown in the Figures.

Figure 12:
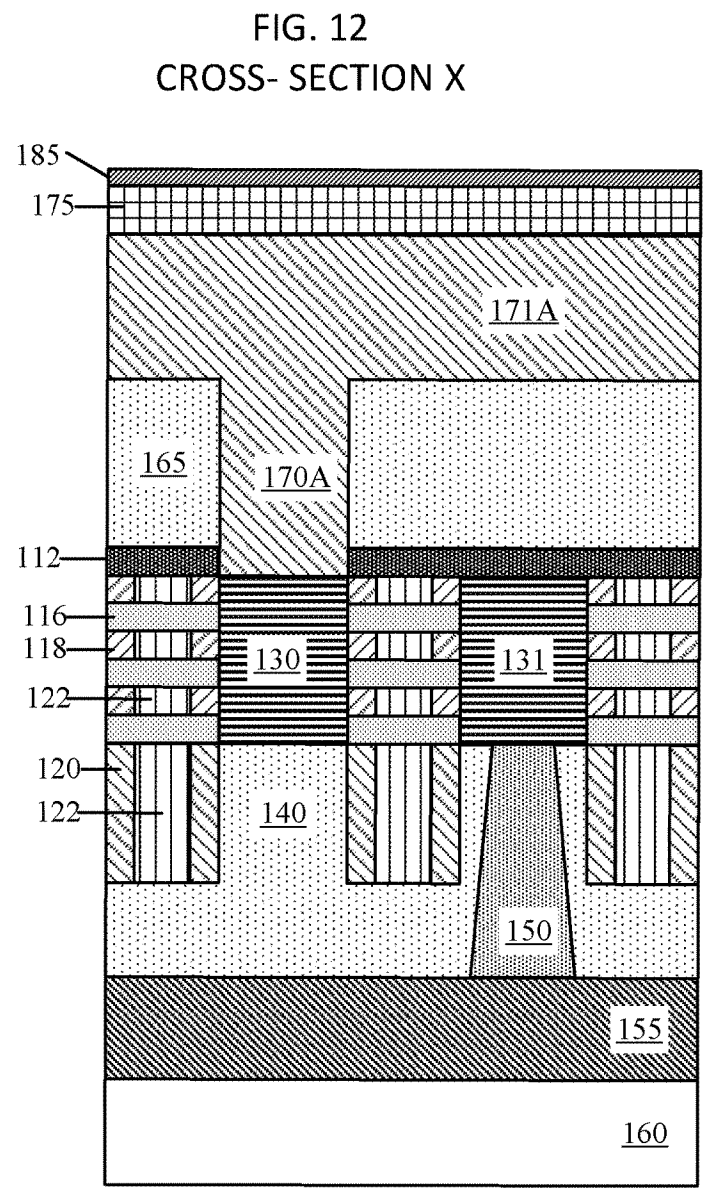
Figure 13:
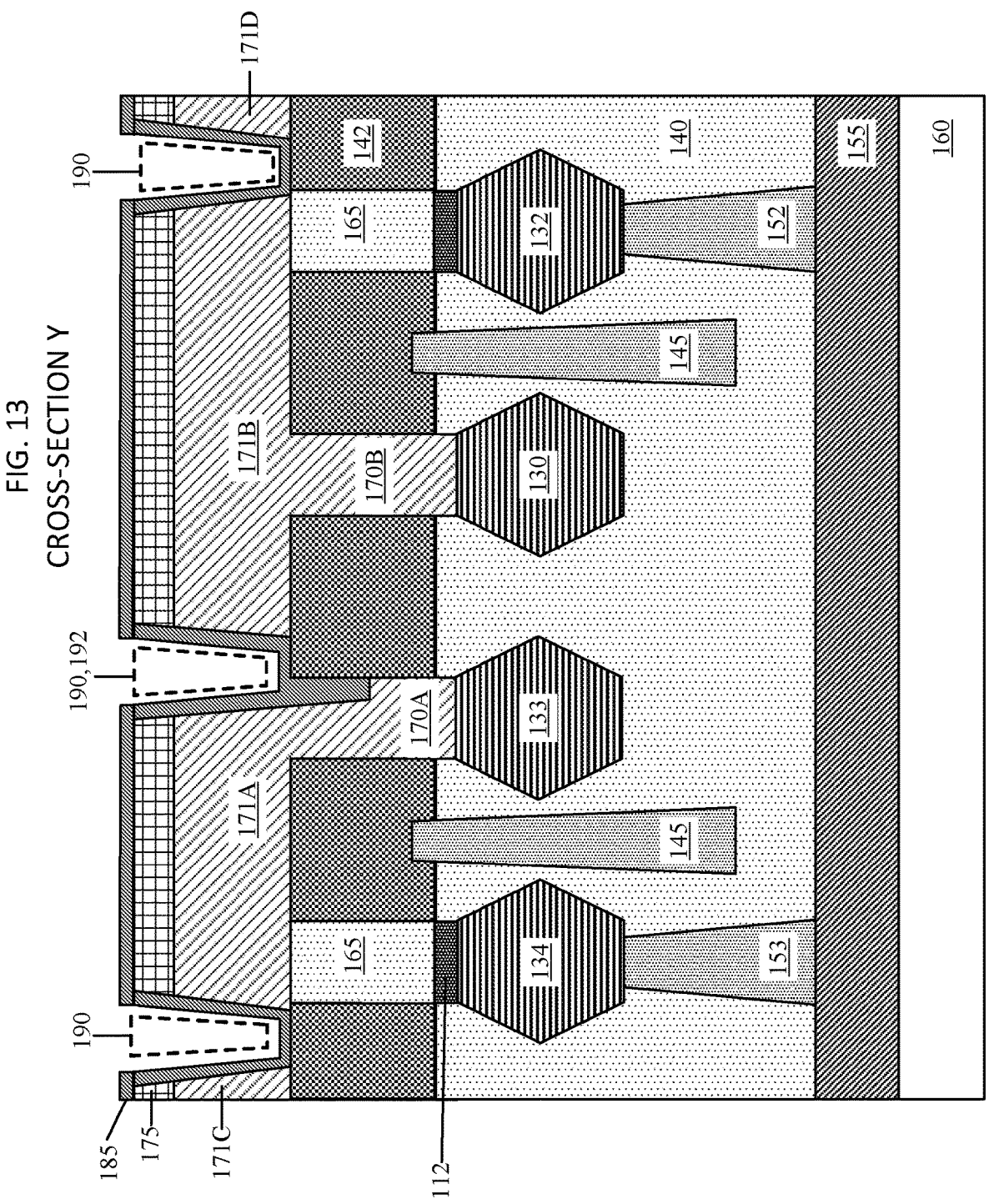
FIG. 13 illustrates a cross section Y of the source/drain region after formation of a repair liner, in accordance with the embodiment of the present invention.

FIGS. 12 and 13 illustrate the processing stage after formation of a repair liner 185. A repair liner 185 can be formed on the exposed surfaces of the exposed layers by, for example, atomic layer deposition or selective metal growth process. The repair liner 185 can be comprised of, for example, Co, Ru or W. The repair liner 185 is formed along the boundaries of the trenches 180 which leads to the formation of the second trenches 190. The repair liner 185 fills in the damage sections of the backside contact 170A caused by the miss-aligned trench 182 to form the repaired trench 192. As illustrated by FIG. 18, the repair liner 185 extends downwards into the protrusion of metal line 171A filling in the hole/gap of the backside contact 170A, thus removing the narrow section created by the miss-aligned trench 182. The repair liner 185 fills the voids/damaged caused by the miss-aligned trench 182, thus repair liner 185 widens the backside contact 170A at the damage location. This leads to a reduction of the resistance between backside metal line 171A and backside contact 170A at this location . . . . The repair liner 185 is sandwiched between the shallow trench isolation layer 142 and the protrusion of contact 170A. Furthermore, the repair liner 185 can fill in other types of damages in the metal lines 171A, 171B, 171C, 171D, and/or backside contact 170A, 170B such as gaps, pivots, holes, uneven surfaces, etc., caused by the etching of the metal layer 170.

Figure 14:
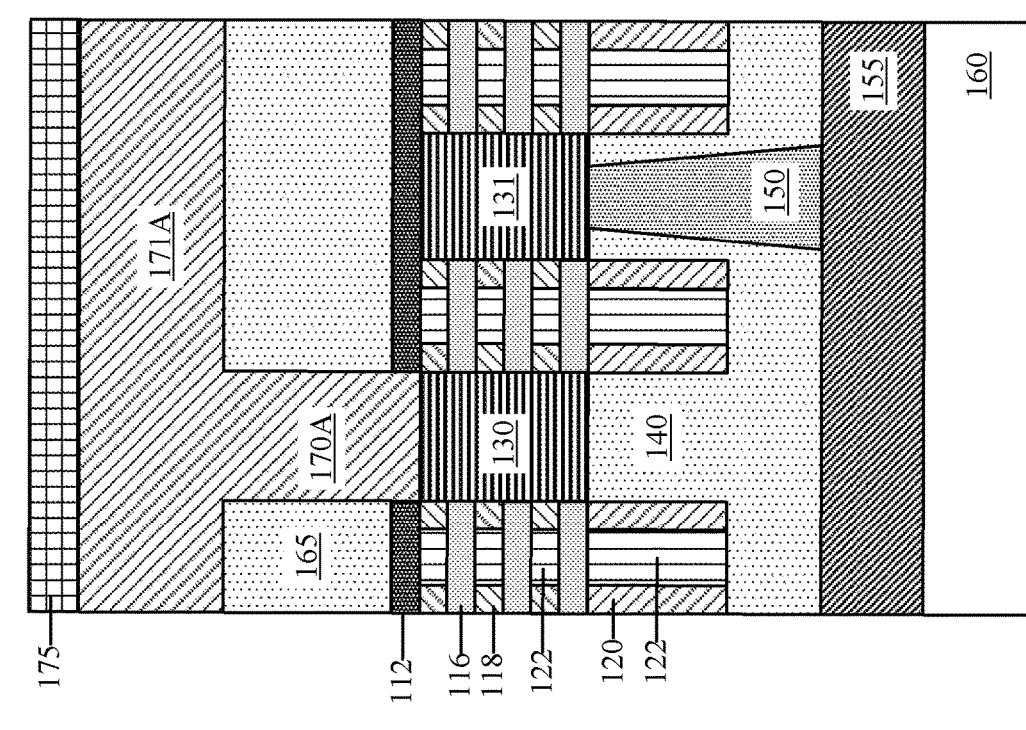
FIG. 14 illustrates a cross section X of the nano stack after removal of horizontal sections of the repair liner, in accordance with the embodiment of the present invention.
Figure 15:
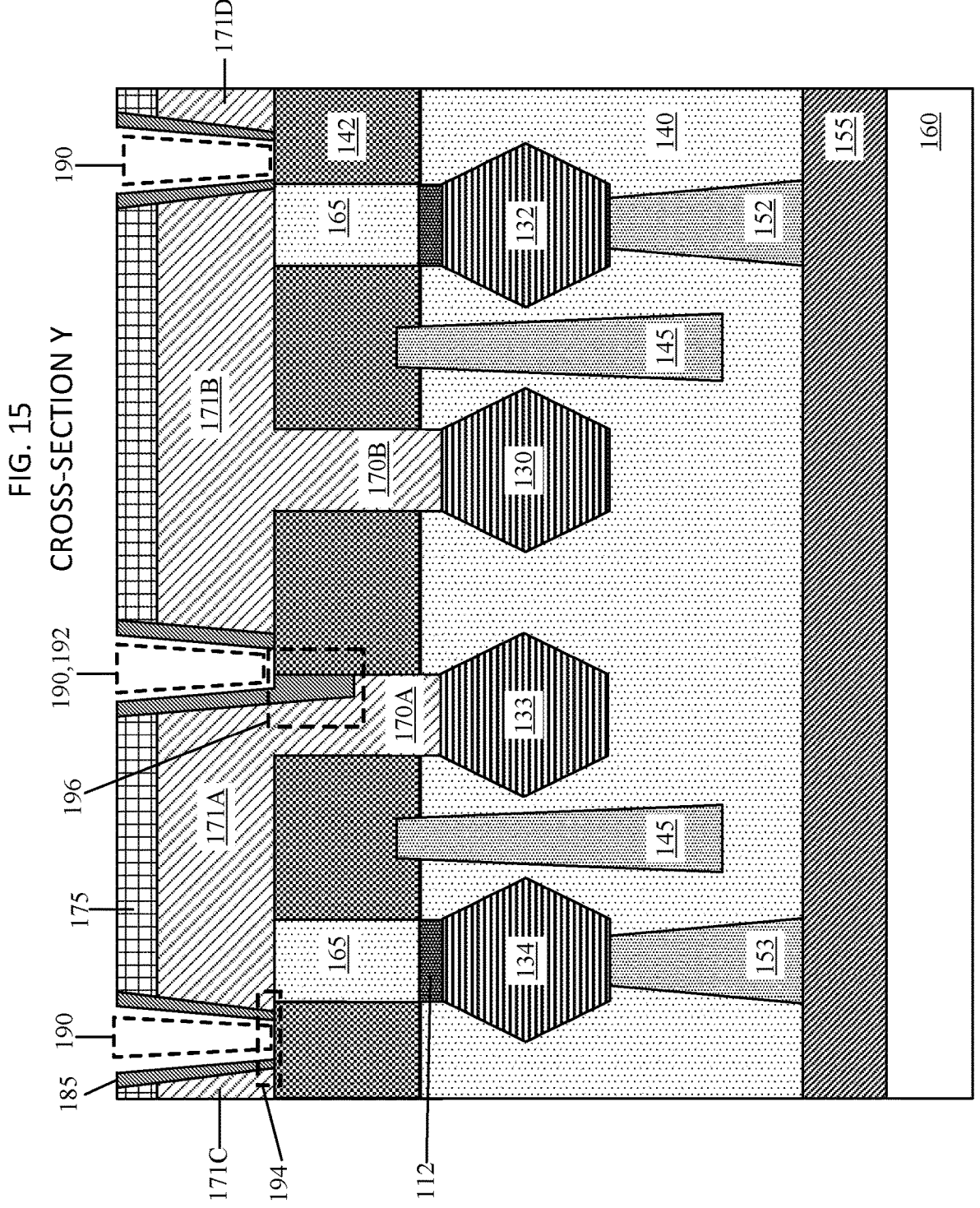
FIG. 15 illustrates a cross section Y of the source/drain region after removal of horizontal sections of the repair liner, in accordance with the embodiment of the present invention.

FIGS. 14 and 15 illustrate the processing stage after removal of horizontal sections of the repair liner 185. The repair liner 185 is etched back to remove horizontal sections of the repair liner 185. Horizontal sections of the repair liner 185 located on top of the lithography layer 175 are removed, and the horizontal sections of the repair liner 185 located at the bottom of the second trenches 190 are removed, as emphasized by dashed box 194. The section of the repair liner 185 that repaired the damage caused by the miss-aligned etching process was not removed, as emphasized by dashed box 196.

Figure 16:
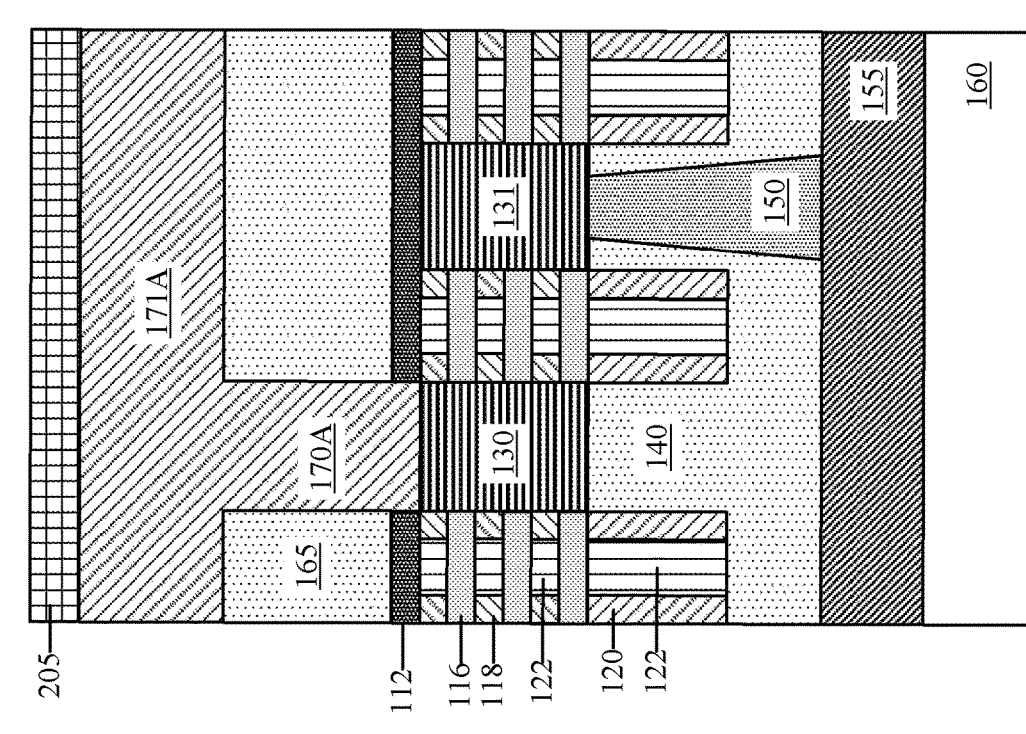
FIG. 16 illustrates a cross section X of the nano stack after a dielectric fill, removal of excess material, and the formation of the backside-power-distribution-network (BSPDN), in accordance with the embodiment of the present invention.
Figure 17:
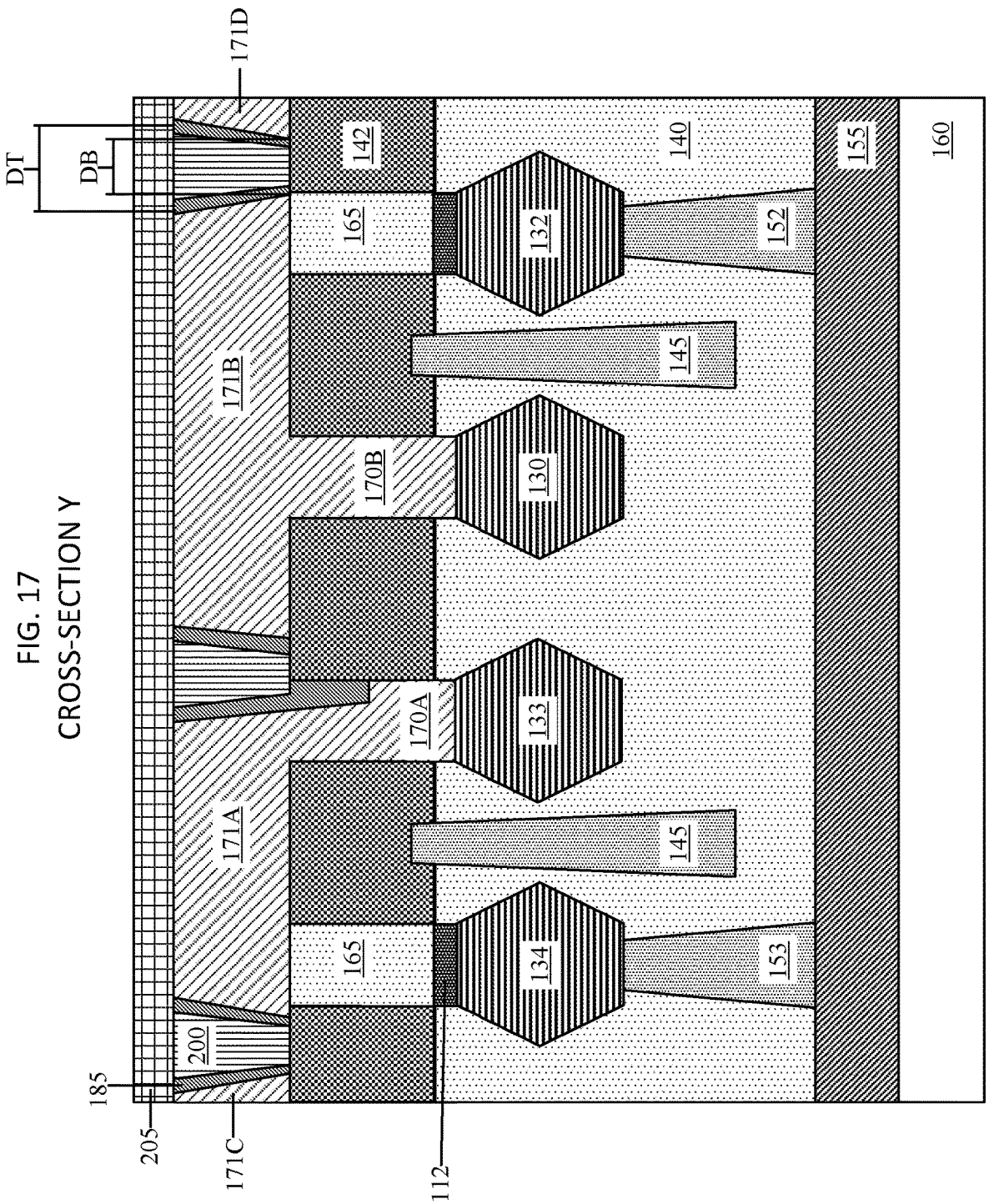
FIG. 17 illustrates a cross section Y of the source/drain region after a dielectric fill, removal of excess material, and the formation of the backside-power-distribution-network (BSPDN), in accordance with the embodiment of the present invention.

FIGS. 16 and 17 illustrate the processing stage after a dielectric fill 200, removal of excess material, and the formation of the backside-power-distribution-network (BSPDN) 205. A dielectric fill 200 is formed by filling the plurality of second trenches 190 with a dielectric material. Sidewalls of the dielectric fill 200 are in contact with the sidewalls of the repair liner 185. The bottom surface of the dielectric fill 200 can be in contact with the shallow trench isolation layer 142, the backside interlayer dielectric layer 165, and/or the repair liner 185. The bottom surface of the dielectric fill 200 is in contact with the repair liner 185 located in repaired trench 192. The backside metal line cut that includes the dielectric fill 200 and the repair liner have top width DT and a bottom width DB, where DT is larger than DB. The width DT and width DB are measure through the source/drain region in parallel to the gate direction. The lithography layer 175, excess repair liner 185, and excess dielectric fill 200 are removed by, for example, a chemical mechanical processing (CMP). A BSPDN 205 is formed on top of the backside metal lines 171A, 171B, 171C, 171D, on top of the dielectric liner 185, and on top of the dielectric fill 200. By utilizing a subtractive etch process to etch the single metal layer 170 to form the backside metal lines 171A, 171B, 171C, 171D, allows for better control of the sizing/spacing of the backside metal lines 171A, 171B, 171C, 171D. The sizing of the cut trenches is not limited by a lithographic printing process since a subtractive etching process is directed to forming the contact cuts instead of forming the space needed to form backside contacts. Lining the trenches 180 with a repair liner 185 allows for the repair of any trenches 180 that were miss-aligned.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
a first nanosheet transistor including a first source/drain and a second nanosheet transistor including a second source drain;
a first backside metal line that includes a first backside contact that is connected to the first source drain, wherein the first backside metal line has a first width as measure along a bottom surface of the first backside metal line, wherein the first backside metal line has a second width as measure along a top surface of the first backside metal line, wherein the first width and the second width are measured through a source/drain region in parallel to a gate direction;

a second backside metal line that includes a second backside contact that is connected to the second source drain, wherein the second backside metal line has a third width as measure along a bottom surface of the second backside metal line, wherein the second backside metal line has a fourth width as measure along a top surface of the second backside metal line, wherein the third width and the fourth width are measured through the source/drain region in parallel to the gate direction, wherein the first width is larger than the second width and the third width is larger than the fourth width; and a backside metal line cut located between the first backside metal line and the second backside metal line.

2. The microelectronic structure of claim 1, wherein the backside metal line cut includes a repair liner and a dielectric fill layer.

3. The microelectronic structure of claim 2, wherein the repair liner is comprised of Co, Ru or W.

4. The microelectronic structure of claim 2, wherein the repair liner is located between the dielectric fill layer and the first backside metal line, and wherein the repair liner is located between the dielectric fill layer and the second backside metal line.

5. The microelectronic structure of claim 1, wherein the backside metal line cut has a fifth width as measure along a bottom surface of the backside metal line cut, wherein the backside metal line cut has a sixth width as measure along a top surface of the backside metal line cut, wherein the fifth width and the sixth width are measured through the source/drain region in parallel to the gate direction.

6. The microelectronic structure of claim 5, wherein the sixth width is larger than the fifth width.

7. The microelectronic structure of claim 6, further comprising:

a backside-power-distribution-network located on top of the first backside metal line, on top of the second backside metal line, and on top of the backside metal line cut.

8. A microelectronic structure comprising:

a first nanosheet transistor including a first source/drain and a second nanosheet transistor including a second source drain;

a first backside metal line that includes a first backside contact that is connected to the first source drain, wherein the first backside metal line has a first width as measure along a bottom surface of the first backside metal line, wherein the first backside metal line has a second width as measure along a top surface of the first metal line contact, wherein the first width and the second width are measured through a source/drain region in parallel to a gate direction;

a second backside metal line that includes a second backside contact that is connected to the second source drain, wherein the second backside metal line has a third width as measure along a bottom surface of the second backside metal line, wherein the second backside metal line has a fourth width as measure along a top surface of the second backside metal line, wherein the third width and the fourth width are measured through the source/drain region in parallel to the gate direction, wherein the first width is larger than the second width and the third width is larger than the fourth width;

a shallow trench isolation layer located around the first backside contact; and a backside metal line cut located between the first backside metal line and the second backside metal line, wherein the backside metal line cut extends into the first backside contact.

9. The microelectronic structure of claim 8, wherein the backside metal line cut includes a repair liner and a dielectric fill layer.

10. The microelectronic structure of claim 9, wherein the repair liner extends into the first backside contact.

11. The microelectronic structure of claim 10, wherein the repair liner is sandwiched between the shallow trench isolation layer and the first backside contact.

12. The microelectronic structure of claim 11, wherein the repair liner is comprised of Co, Ru or W.

13. The microelectronic structure of claim 12, wherein the repair liner is located between the dielectric fill layer and the first backside metal line, and wherein the repair liner is located between the dielectric fill layer and the second backside metal line.

14. The microelectronic structure of claim 13, wherein the backside metal line cut has a fifth width as measure along a bottom surface of the backside metal line cut, wherein the backside contact cut has a sixth width as measure along a top surface of the backside metal line cut, wherein the fifth width and the sixth width are measured through the source/drain region in parallel to the gate direction.

15. The microelectronic structure of claim 14, wherein the sixth width is larger than the fifth width.

16. The microelectronic structure of claim 15, further comprising:

a backside-power-distribution-network located on top of the first backside metal line, on top of the second backside metal line, and on top of the backside metal line cut.

* * * * *